(12) United States Patent
Paderov et al.

(10) Patent No.: US 7,229,675 B1
(45) Date of Patent: Jun. 12, 2007

(54) PROTECTIVE COATING METHOD FOR PIECES MADE OF HEAT RESISTANT ALLOYS

(76) Inventors: Anatoly Nikolaevich Paderov, ul. Soni Morozovoy, d. 190, kv. 29, Ekaterinburg 620055 (RU); Jury Genrikhovich Vexler, ul. Tveritina, d. 11, kv. 39, Ekaterinburg 620100 (RU)

(*) Notice: Subject to any disclaimer, the term of this patent is extended or adjusted under 35 U.S.C. 154(b) by 0 days.

(21) Appl. No.: 10/203,021

(22) PCT Filed: Apr. 10, 2000

(86) PCT No.: PCT/RU00/00126

§ 371 (c)(1),
(2), (4) Date: Aug. 5, 2002

(87) PCT Pub. No.: WO01/61066

PCT Pub. Date: Aug. 23, 2001

(30) Foreign Application Priority Data

Feb. 17, 2000 (WO) ..................... PCT/RU00/00058

(51) Int. Cl.
*H05H 1/24* (2006.01)
*C23C 14/08* (2006.01)
*C23C 14/16* (2006.01)
*C23C 14/18* (2006.01)
*C23C 14/30* (2006.01)
*C23C 14/48* (2006.01)
*C23C 14/58* (2006.01)
*H05H 1/46* (2006.01)
*C23C 14/34* (2006.01)

(52) U.S. Cl. ............... 427/529; 427/527; 427/530; 427/531; 427/533; 427/535; 427/539; 427/566; 427/567; 427/576; 427/250; 204/192.16; 204/192.38

(58) Field of Classification Search ................ 427/523, 427/525, 527, 528, 529, 530, 531, 533, 534, 427/535, 539, 563, 564, 569, 576, 577, 578, 427/580, 540; 204/192.16, 192.38, 192.32, 204/298.06, 298.23, 298.41; 118/723 R, 118/723 MP, 729

See application file for complete search history.

(56) References Cited

U.S. PATENT DOCUMENTS 3,915,757 A * 10/1975 Engel ..................... 148/278

(Continued)

FOREIGN PATENT DOCUMENTS

EP 0356111 2/1990

(Continued)

OTHER PUBLICATIONS

Kazakov, V.M., Derwnt Abstract of Ru 2176184C2 Nov 27, 2001 (acc# 2002-081391).*

(Continued)

*Primary Examiner*—Marianne Padgett
(74) *Attorney, Agent, or Firm*—Collard & Roe, P.C.

(57) ABSTRACT

The invention relates to metallurgy and mechanical engineering, in particular to the development of methods for providing metallic pieces with protective coatings with a view to improving the performance characteristics thereof. In accordance with the inventive method, a multilayer coating is formed by combining and simultaneously or consecutively using of various technologies including ion-plasma evaporation diffusive metallization and controlled atmosphere thermal treatment. The obtained coatings possess superior characteristics with respect to overall properties and are used for gas turbine construction, in particular, for manufacturing gas turbine vanes of aircraft engines.

14 Claims, 2 Drawing Sheets

U.S. PATENT DOCUMENTS

| | | | |
|---|---|---|---|
| 4,252,626 A * | 2/1981 | Wright et al. | 204/192.15 |
| 4,309,261 A * | 1/1982 | Harding et al. | 204/192.15 |
| 4,649,086 A * | 3/1987 | Johnson | 428/627 |
| 4,729,905 A * | 3/1988 | Zhed et al. | 427/581 |
| 4,854,265 A | 8/1989 | Ohta et al. | |
| RE34,173 E * | 2/1993 | Kerber | 428/610 |
| 5,545,484 A | 8/1996 | Yamaguchi et al. | |
| 5,656,383 A * | 8/1997 | Tanaka et al. | 428/627 |
| 6,083,567 A * | 7/2000 | Vesnovsky et al. | 427/523 |
| 6,096,438 A * | 8/2000 | Takagi et al. | 428/472.2 |
| 6,558,822 B2 * | 5/2003 | Nagasaka et al. | 428/700 |
| 6,723,391 B2 * | 4/2004 | Derflinger et al. | 427/576 |
| 2004/0126492 A1 * | 7/2004 | Weaver et al. | 427/250 |
| 2004/0172826 A1 * | 9/2004 | Memmen et al. | 29/889.1 |
| 2005/0031794 A1 * | 2/2005 | Darolia et al. | 427/523 |
| 2006/0093752 A1 * | 5/2006 | Darolia et al. | 427/523 |

FOREIGN PATENT DOCUMENTS

| | | | |
|---|---|---|---|
| EP | 0510468 | | 10/1992 |
| GB | 2208875 | | 4/1989 |
| GB | 2226334 | | 6/1990 |
| JP | 06-299350 | * | 10/1994 |
| RU | 94011658 | | 5/1996 |
| RU | 2078148 | | 4/1997 |

OTHER PUBLICATIONS

Kazakov, V.M. Derwent Abstract of Ru 2113971 C1 Jun. 27, 1998 (acc# 1999-632159).*

Translation of JP 06-299350, to Saito et al., published Oct. 25, 1994.*

English translation of RU 2078148 Abstract.

English translation of RU 94011658 Abstract.

* cited by examiner

PROTECTIVE COATING METHOD FOR PIECES MADE OF HEAT RESISTANT ALLOYS

FIELD OF THE INVENTION

This invention relates to metallurgy and mechanical engineering fields and more specifically to the development of methods that improve service life and durability of machine parts, particularly of turbine components for power production and transport industry, and primarily of aircraft engine gas turbine blades and vanes, by means of modification in protective coating technology.

BACKGROUND TO THE INVENTION

Many machine parts have to operate under heavy working load and variable temperature in aggressive environment, which results in their deterioration and calls for protective coating to be applied on such parts. In the field of transport industry and power turbine construction and, particularly, gas turbine manufacturing the surface protection of parts is the most critical. Gas turbine units (GTU) are applied widely in the state-of-the-art technology: aircraft and helicopter's engines, marine gas turbine engines (GTE), power GTU and gas compressor units (GCU). Turbine blades are the major parts that determine reliability, economy in use and the service life of such GTU. Such blades operate under very severe conditions: at elevated temperatures, under considerable fatigue and thermal loads, and in aggressive gas flows containing oxygen, sulfur, vanadium oxides and other chemically-active elements.

Some blades may have internal passages, which are prone to oxidization, especially if made of currently employed high temperature superalloys with low content of chromium. During use, the coating undergoes cracking, flaking, diffusion dispersal, corrosion and erosion attack, and the chemical and phase compositions change in the surface layers. As a result, durability of blade decreases and such blades have to be laid off.

Turbine blades are manufactured of expensive superalloys by employing a complicated technology, for instance, oriented crystallization or monocrystal casting, so their price is extremely high. Therefore, protective coating technologies, which improve durability and service life of such blades, provide great economical benefits and significant technical advantages.

Well-known are the protective coating methods, when aluminide coatings or Me—Cr—Al—Y coatings are applied on superalloys (U.S. Pat. Nos. 3,542,530; 3,544,348; 3,918,139; 3,961,098; 3,928,026; 3,993,454; 4,000,507; 4,132,816; 4,034,142); aluminide coatings alloyed with noble metals Pt, Ro, Pd (U.S. Pat. No. 3,819,338); the method for protection of gas turbine blades from high temperature corrosion (Russian Federation Patent No. 2033474), which includes vacuum deposition of two layers: a Me—Cr—Al—Y layer and a layer of aluminum-based alloy, with subsequent vacuum annealing.

Diffusion methods for powder and gas vapor deposition are known to create aluminum intermetallic coatings, which, while having quite high heat-resistance, at the same time possess low resistance to thermal stresses and to corrosion in the chemically aggressive environment of combustion materials. Coatings alloyed with noble metals are expensive and their use is not always economically sound. Slip powder technologies can not provide coatings, which would be uniform in thickness, and the density of such coatings is not sufficient. Aluminide coatings, too, have high thermal conductivity and insufficient correlation between linear expansion coefficients in oxide ceramics layers.

Frequently occurring fault with multi-layer coatings of Me—Cr—Al—Y and their modifications is that they do not provide long enough service life of a machine component either due to insufficient heat-resistance or as a result of flaking and corrosion of the coating during use.

One has to face really serious problems at the stage of preparing the surface of superalloy-made components for coating by vacuum plasma deposition in order to obtain high adhesion of the coating with the substrate metal.

U.S. Pat. No. 4,080,486 describes a coating method by diffusion powder deposition of aluminide onto the surfaces of components, following the deposition of vacuum plasma Me—Cr—Al—Y coating. This patent neither fully uses all means to offer maximum resistance to gas corrosion, nor provides protection for internal passages of cooled cavities.

European patent EP 0-897-996A describes a complex coating for heat-resistant nickel- or cobalt-based alloy matrixes, which, for instance, would be used for gas turbine engine blades. The said patented coating comprises a MeCrAlY type of compound, wherein Me is the element selected from the group consisting of iron, nickel and cobalt. The said coating is subjected to aluminizing by means of gaseous phase diffusion saturation, and also includes the formation of a diffusion aluminide coating over the MeCrAlY system on the outer surfaces and deposition of an aluminide coating on the internal surfaces of a coated component, both with and without platinum bondcoat applied.

The said method is the closest to the proposed invention, however, it leaves room for further improvement of resistance to flaking and erosion, for enhancing thermal fatigue characteristics of coated alloys and for improvement of sulfur corrosion resistance.

Also known is Russian Federation Patent No. 2073742 that describes a method for protecting coating composed of multi-component Ni—Cr—Al—Ta—Y alloy with subsequent chrome aluminizing by powder technique and quenching after retention in vacuum furnace at 1200° C.

Even with this method, there is still an opportunity to further improve performance characteristics of coatings and durability of coated parts.

Russian Federation Patent No. 2113538 describes repetitive pulse ion plasma treatment of parts and a device for such treatment, which incorporates an arrangement for continuous plasma generation, and the radiation doze is controlled by altering the repetition rate and pulse duration and by varying the source/part gap. This patent does not cover the issues of coating formation nor does it address the capabilities of patented device to improve the coating technology.

Russian Federation Patent No. 2029796 describes a method for a combined ion-plasma treatment, which implies surface treatment of parts, in particular, high-speed steel plates, by directed flow of particles. This directed flow is meant to provide partial destruction of brittle passivating phases in the surface, which affords better adhesion between the coating and substrate material.

The present invention is to address the problem of durability and reliability of machine components, particularly, parts made of iron-, nickel and cobalt-based superalloys with complex high-temperature protective coating, and, more specifically, to cover modifications of complex protective coating methods developed for such parts, especially for gas turbine blades and vanes.

SUMMARY OF THE INVENTION

It is an object of the present invention to provide a technique of coating deposition on iron-, nickel- and cobalt-based superalloy surfaces of machine parts. The aforesaid coating is comprised of a plurality of microlayers of various purpose and thickness: microlayers with high heat-resisting characteristics; microlayers with high plasticity; barrier microlayers that prevent coating components from diffusion into substrate and inter-layers; microlayers that ensure strong bonding between the coating and substrate and between different microlayers; corrosion-resistance microlayers; heat-barrier microlayers that help decrease temperature of the matrix superalloy.

Some microlayers perform a few functions simultaneously. For instance, intermetallic layers serve as suppliers of components into the outer zone in order to recover the depleted oxide phases, such as aluminum oxide, and at the same time serve to prevent diffusion into internal layers and the superalloy substrate.

The method claimed involves deposition of the following basic microlayers:

1—(IM) intermetallic microlayers of the type $Me_1Me_2$, $Me_1$ ($Me_2$)$_3$, wherein $Me_1$ represents Ni, Co, Fe, and $Me_2$ represents Al, Ti, Zr, Cr, and microlayers of solid solutions based thereon;
2—(TM) Transitional microlayers resulted from ion implantation of elements selected from the group consisting of inert gases, carbon, chromium, aluminum, silicon and of elements from the IIIB Group (SC Y, La) and IVB Group (Ti, Zr, HF);
3—(MCA) microlayers of many-component condensed alloys of the types (Co,Ni)—Cr—Al—Y and Al—Cr—Si, Ni—Ni—Y, Al—Ni—Si—Y;
4—(OL) oxide layers consisting of $ZrO2$, $Y2O3$, MgO, $Al2O3$, $Al_2O_3$, CaO and spinels of the said oxides.

It is a further object to provide a technique of complex many-layer coating deposition and to improve durability of machine parts by combination and concurrent use of diffusion, vacuum-plasma, electron beam, ion implanting and annealing in the controlled atmospheres technologies.

The essence of the proposed method is that the most effective combination of microlayers is selected, and deposition is carried out simultaneously or consecutively with ion implantation of selected elements into the surface layers. That makes it possible to obtain protective coatings with a better set of performance characteristics and to considerably improve durability of parts, especially gas turbine blades and vanes currently in use.

It is a further object of the present invention to claim arrangements for deposition of many-layer protective coatings on machine parts, particularly, on gas turbine blades. These arrangements enable control over ion energy thus providing a capability to carry out several operations (e.g. cleaning, sputtering, etching, deposition and implantation) in one plant, which is able to keep up high quality of surface preparation and to retain a high degree of surface finish. Diffusion metallization by gas circulation method and a heat treatment in controlled atmospheres provide protection of surfaces, which are hard to reach, from oxidization and gas corrosion, and help form the optimal composition and structure of oxide phases.

To achieve the aforementioned objects, complex protective coatings are deposited that consist of many layers, with the composition, structure and properties of coating phases being modified by ion implantation and additional thermal treatments.

During ion plasma deposition the coating components are deposited onto the surface of a part while the part is being rotated in a special chamber. At each certain moment of time there are new layers of condensed materials formed on the surface, which thickness is comparable with the depth of ion implantation normally obtained at industrial facilities. Therefore, the depth of modified zone depends on deposition conditions and ion implantation parameters. As a result, when implantation and the coating deposition are carried out concurrently, the accompanying effects are more pronounced as compared to the case when the two processes run in sequence. Deposition conditions and ion implantation parameters are selected, based on the requirements to the desired performances of different constituting microlayers and to the coating as a whole.

The number of microlayers in a many-layer coating is determined by the operation conditions in which a specific coated machine part is to be used and can vary from 3 to 300, and the thickness of individual microlayer ranges from 0.01 up to 300 microns. The order of the plurality of microlayers and the thickness of microlayer are selected depending on the purpose and replacement life of the coated part. Diffusion zones can be formed between the microlayers either as a result of coating deposition or during annealing or further use.

Embodiments of the present invention utilize surface impregnation technologies, i.e. diffusion metallization, via gaseous phases or by powder technique, and coating machines for many-layer coating deposition are equipped with ion implanters; furnace equipment with controlled atmospheres is used to form the said diffusion zones and oxide layers.

DETAILED DESCRIPTION OF THE INVENTION

Figure 1:
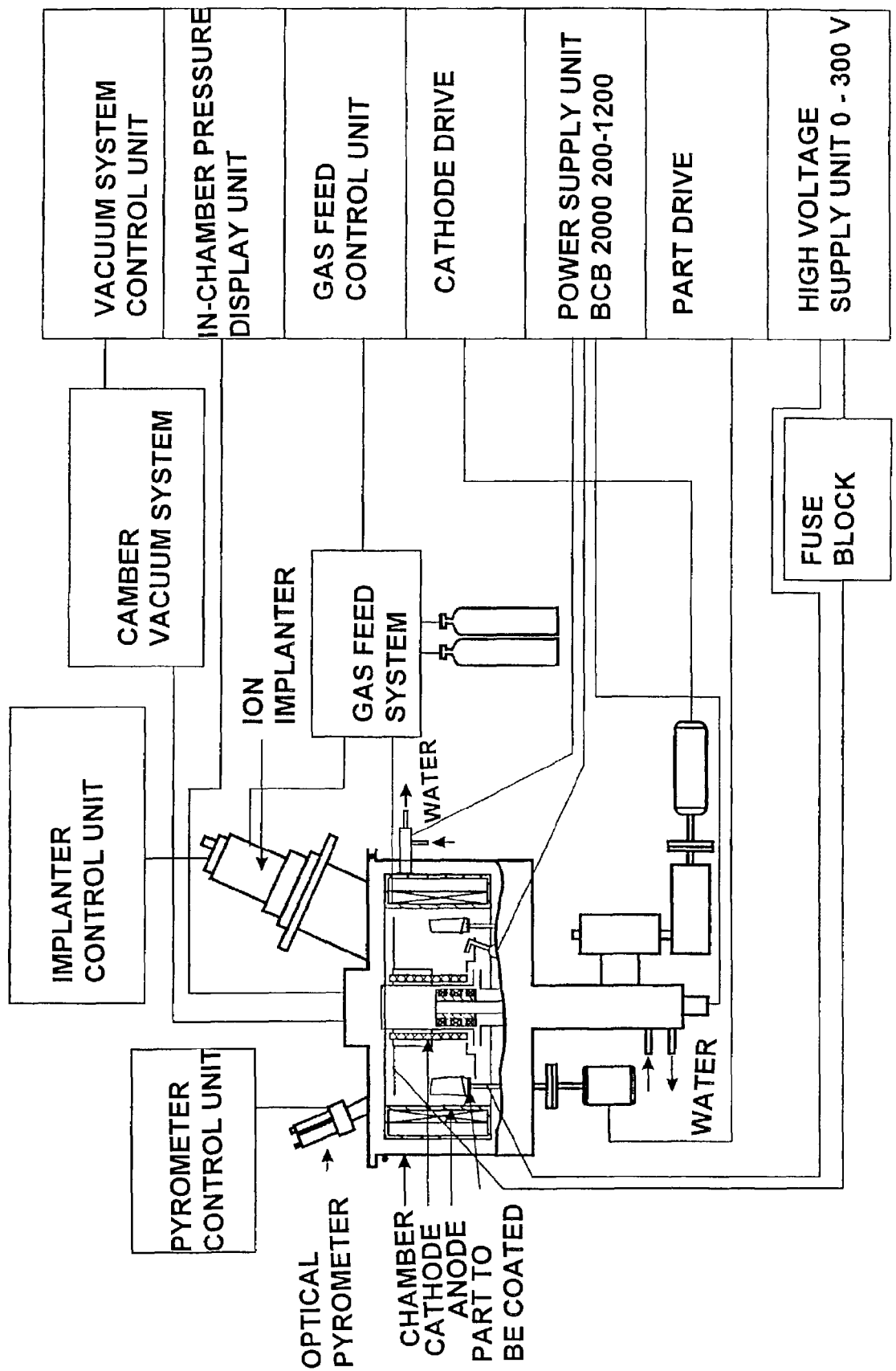
FIG. 1/2. Flow chart for MAP-1 coating machine with ion implantation

FIG. 1/2 shows a schematic of the ion plasma deposition machine combined with ion implanting facility.

The machine contains an ion plasma deposition chamber with a rotating table on which the part to be coated is mounted, an inert/non-inert gas feed system monitored to feed the gas atmosphere into the ion plasma deposition chamber, a monitoring system of ion sputtering and coating deposition, and a temperature monitoring device.

An ion source is mounted in the lid of the working chamber, which produces ions of inert and reacting gases (such as nitrogen, acetylene, methane, diborane, and oxygen) for corresponding implantation by ions of an inert gas (argon, neon). To achieve this, the source is equipped with a self-contained feed monitoring system of gas mixture supply. Besides, the implanter has a source of metal ions. The implanter is mounted in the lid in such a way that the flow of high-energy ions be directed onto the surface of part to be coated, with the part being rotated by means of a planetary train. The implanter is installed so that there is a special gate that protects the ion source from unwanted coating components sputtered during ion plasma deposition.

As an example, modified industrial MAP-1 plants were used as coating machines for many-component alloy deposition and ion implantation; and HHB6.6-based equipment was used to deposit transitional layers and to carry out ion agitation by inert gases. The HHB6.6 type of plants were equipped with ion sources with a non-heating cathode, with accelerated voltage ranging between 10–40 kV and the ion beam cross-section of 100 cm$^2$ at a beam current of 10–75 mA.

Diffusion metallization is carried out by gas circulating coating deposition or by powder technique.

Various number, composition and thickness of microlayers constituting the full coating can be reached by altering the conditions of diffusion metallization (i.e. time, composition of diffusing elements, temperature and saturation conditions) or by changing the operation mode of ion plasma sputtering and ion implantation (temperature-time relationship, energy and composition of plasma, and ion implantation parameters).

By the term "microlayer", in this specification and claims, is meant a layer of pure metal, multiple-component metal alloy, or a combination of several metals, i.e. intermetallic compounds or complex compounds of the said metals with non-metals. The said microlayers of metals or said alloys or metal/non-metal compounds are deposited by means of deposition of ions or neutral particles under an appropriate atmosphere.

A single microlayer should be deposited to a desired thickness, preferably 0.01–100 microns. The total number of microlayers depends on the specific operation conditions of a machine part to be coated and ranges from 3 to 300.

The microlayer may be an essentially discrete layer distinct from the adjacent substrate or microlayers previously deposited; or it may be a mixture therewith.

Intermetallic microlayers (IM) have a phase composition as $Me_1Me_2$—($\beta$) and $Me_1(Me_2)_3$—($\gamma^1$), solid solutions—($\gamma$), where $M_1$ represents nickel, cobalt and iron, and $Me_2$ represents aluminum, titanium and other alloying components. The said microlayers are deposited onto the iron-, cobalt- or nickel-based superalloy matrix or onto a coating layer previously produced by ion-plasma deposition, electron-beam sputtering or implantation, by means of diffusion metallization or by ion-plasma sputtering and annealing.

In the preferred embodiments, diffusion metallization is carried out via gas vapor deposition, for instance, by gas circulation coating (aluminizing, chrome aluminizing, silicon aluminizing, boron aluminizing, and zirconium aluminizing).

Intermetallic microlayers (IM) in an alternative embodiment are obtained by means of combining ion plasma sputtering of an alloy of appropriate composition with diffusion annealing in the controlled atmosphere.

Transitional microlayers (TM) are formed as a result of ion implantation with neutral gas, carbon, chromium, silicon, or metals selected from the Group IIIB-IVB (Sc, Y, La, Ti, Zr, Hf) or a combination thereof.

In an alternative embodiment, transitional microlayers (TM) are obtained by ion plasma deposition of said metals on the prepared surface and by ion treatment, when the surface is bombarded by the particles of inert gas, carbon or oxygen.

Microlayers of many-component condensed alloys (MCA) such as, for instance, alloys of the type Ni—Cr—Al—Y, Ni—Co—Cr—Al—Y, Al—Cr—Si—Ni—Y, Al—Si—Ni—B, are deposited in an ion-plasma deposition plant or electron-beam equipment.

One or more microlayers of complex coating is subjected to ion implantation in order to create a better bonding between microlayers and improve performance characteristics of coating. As this takes place, compounds are being formed, which are characterized by stronger bonding force between their components, and new compounds are being created, which existence is not in keeping with the equilibrium diagrams, and structural changes occur in some individual microlayers and in the whole coating as well.

Such creation of new compounds occurs in parallel with the flaw formation processes, when superdispersed and amorphous structures are formed and structural transitions take place, which result in the formation of denser packing arrangements, for instance, from BCC into FCC and HCP structures.

Precipitates of metal/non-metal and intermetallic compounds are formed at the radiation doses exceeding $10^{16}$ ion/cm$^2$, and are quite stable and characterized with strong atomic bonding. Implanting with such elements as yttrium, lanthanum, scandium and hafnium hinders the oxide film flaking, slows the oxidization rate and improves adhesion between the oxides and metal. The concentration of implanted element is considerably higher in the thin surface layer as compared to that in the case of bulk alloying, therefore the properties of surface coating differ considerably from the properties of alloys of the said components. For instance, alloying the bulk metal with yttrium, lanthanum or other rare-earth elements would impair its strength and plasticity, while the surface alloying positively influences its resistance to gas corrosion without detrimental effect on the strength characteristics.

Further stage of coating deposition is gas-plasma deposition by slip casting or electron-beam evaporation of heat-reflecting ceramics layer which can, for instance, be made of zirconium oxide stabilized with yttrium.

Another operation of coating deposition is annealing in a controlled atmosphere or in vacuum at a certain residual pressure of oxygen in the chamber in order that diffusion zones be formed in the coating and an oxide layer of optimal structure and composition be produced in the surface.

Yet another operation is high-energy ion treatment by means of an implanter, during which high energy flows of an inert gas, oxygen or elements selected from the group of lanthanum, yttrium, zirconium and magnesium are used immediately upon completion of the thermal and chemico-thermal treatments of parts in order to carry out modification of the surface layer and optimization of the residual stress level.

For parts operating at a working temperature of 800–900° C. in the environment of a comparatively low corrosiveness of combustion materials, it is possible to utilize simple aluminide coatings obtained by ion-plasma deposition or by diffusion metallization with surface modification to be carried out both of the superalloy surface prior to metallization and of the coating after deposition.

In some other embodiments it is necessary to apply coatings consisting of many-component alloys (MCA) of the type nickel-cobalt-chromium-aluminum-yttrium, with modification of the superalloy surface being conducted prior to coating deposition and modification of the coating following the coating deposition.

In an alternative embodiment a combination of processes employs technologies of gas circulation coating deposition and ion-plasma deposition arrangements equipped with ion implanters. That makes it possible to provide protection of both internal passages of air-cooled blades and outer surfaces of parts, by means of creating in the surface of nickel-cobalt-chromium-aluminum-yttrium coating a nickel- and aluminum-based intermetallic layer of high resistance to oxidization. As this occurs, the resistance of such coating is improved due to adhesive layers formed at the coating/substrate boundary and due to elements implanted into various microlayers, which improves performance characteristics of the coating.

In one of the embodiments, ion-plasma deposition of a many-component condensed alloy is envisioned along with modification by means of ion implantation into microlayers combined with diffusion metallization by making an aluminum and nickel intermetallic layer doped with chromium and silicon and further electron-beam or gas-thermal deposition of thermal resisting ceramics.

Such complex coating contains a plurality of various microlayers. Firstly, a barrier microlayer, for instance, chromium or hafnium carbides, is deposited onto the superalloy substrate by means of ion-plasma sputtering, which serves as a barrier to diffusion of coating elements into the substrate superalloy and of alloy components into the coating. Then an intermetallic layer is deposited by means of, for instance, ion-plasma sputtering of aluminum-based alloy of Ni—Cr—Al—Y and yttrium implantation is carried out simultaneously. Further, a many-component alloy of Ni—Cr—Al—Y is deposited and upon yet another implantation with yttrium the part is subjected to diffusion metallization by aluminizing or silicon aluminizing via gas circulating evaporation. The said technique affords protection to the internal air-cooled passages and improves heat- and corrosion-resistance of outer surfaces of parts.

Further on, the outer surfaces are coated with oxide layers, for instance, zirconium oxides stabilized with yttrium oxides to improve their resistance to phase transformations. The next treatment is annealing in vacuum and yttrium implanting to form a dense oxide film on the surface, which improves heat-resistance and corrosion resistance of the coated part and, at the same time, reduces internal stresses in the coating.

In another embodiment a condensed many-component alloy was deposited on the high-temperature alloy and then all the aforementioned procedure were carried out.

To achieve the aforementioned objects of the invention, a part made of high-temperature alloy is placed in a vacuum plasma deposition chamber after previous cleaning and degreasing.

It is established that under the effect high-energy particle flows incident on a metal surface, various processes take place: thermal activation and atomic migration, desorption, displacements of atoms in the crystal lattice, enhancing of cohesive and adhesive forces, implantation, sputtering, electronic excitation, etc.

In the preferred embodiments, preparation of surface implies not only the processes of desorption and etching but also surface modification by means of ion-implanted doping and ion agitation.

Therefore, the coating method claimed involves each or, at least, some of the following stages below:

(1)—ion cleaning of a surface;
(2)—heating up to a given temperature;
(3)—ion implantation with elements selected of the group consisting of argon, carbon, chromium, III-IVB with the purpose of surface modification and improving adhesion between the coating and substrate;
(4)—ion-plasma deposition of a microlayer consisting of elements selected from the Group IIIB, IVB, VIB;
(5)—ion agitation of a metal microlayer with high-energy argon ions;
(6)—a many-component condensed alloy microlayer deposition;
(7)—implantation of the said microlayer with elements selected from the Group IIIB-IVB;
(8)—diffusion metallization with elements selected from the group containing aluminum, silicon, nickel, chromium, zirconium, titanium, separately or in a combination thereof;
(9)—annealing in vacuum or in a controlled atmosphere;
(10)—ion implantation treatment with argon, oxygen and elements selected from the Group IIIB.

Figure 2:
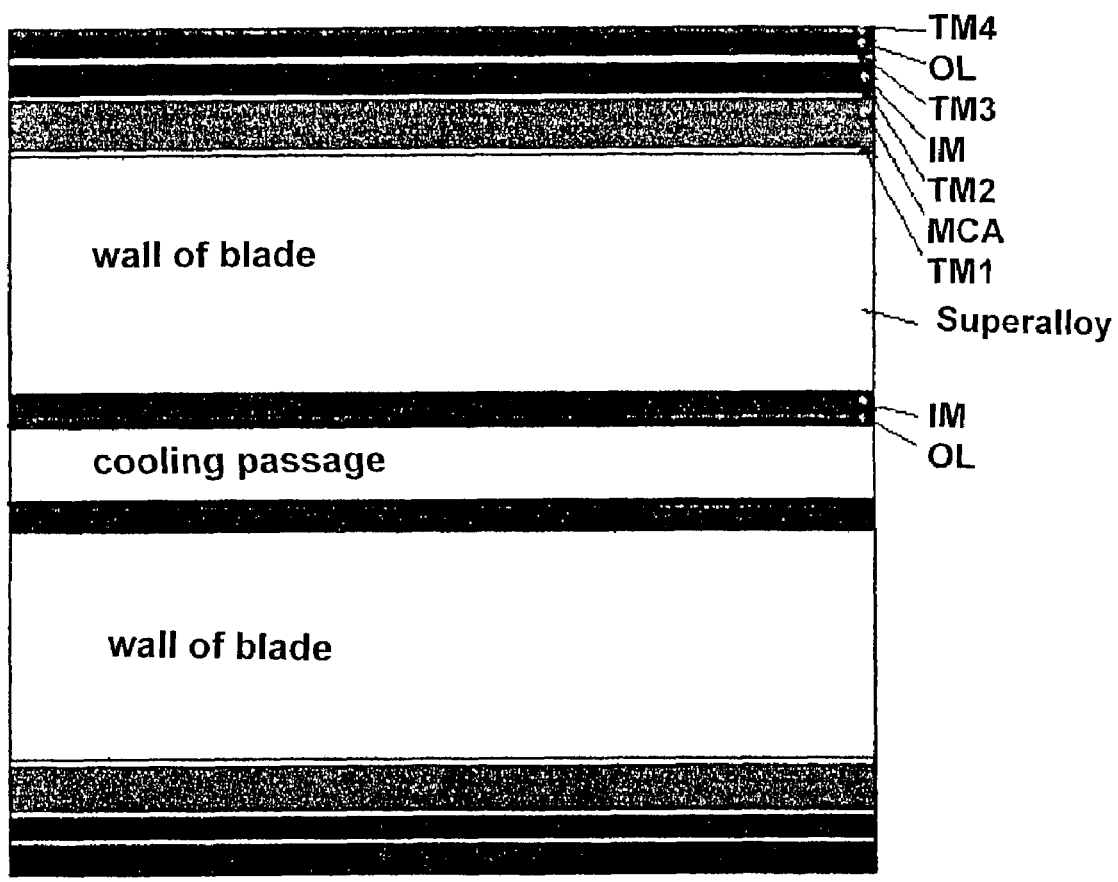
FIG. 2/2. Schematic of a complex coating on an aircraft engine blade made of superalloy, with air-cooled passages: 1. (SA) a superalloy; 2. (TM1) a transitional modified microlayer; 3. (MCA) a microlayer of many-component condensed alloy; 4. (TM2) a transitional implanted microlayer; 5. (IM) an intermetallic microlayer; 6. (TM3) a transitional implanted microlayer; 7. (OL) an oxide layer; 8. (TM4) an outer modified layer of oxides.

FIG. 2/2 shows a schematic for one of the embodiments of the complex protective coating obtained by the said technology.

An alternative embodiment of the present invention involves deposition a ceramics layer on the said coating in order that a thermal barrier be made to reduce working temperature of the substrate material. Making a strong transitional layer, which can serve as a bonding between the ceramics thermal-barrier layer and the metal corrosion-resistant layer, is quite a complicated task of material engineering.

In the present invention, this task is solved by creation of a transitional adhesive zone formed by implanted elements selected from the Group IIIB-IVB with the surface layer coating materials. Such transitional zone is made by depositing a thin metal layer of the said metals in a controlled atmosphere, followed by ion implantation or ion agitation. Ion implantation is carried out by means of radiation of high-energy ions of the said metals into the coating surface; and ion agitation is performed via radiation with inert gas ions of a thin layer of one of the said metals. Also possible is a combination of the aforementioned processes of ion implantation and agitation, or implantation with oxygen after the deposition of a thin layer of the said metals.

Heat-shielding oxide layers were deposited by means of gas-plasma, electron-beam or slip casting deposition of zirconium oxides stabilized with yttrium oxides or other ceramics materials.

Comparative analysis has proved that the proposed inventive schemes of technology are in keeping with the criteria of patentability and are unique in terms of solving the aforementioned tasks. The combination of features claimed has not been revealed in the field of invention, nor has it been identified in the relative interdisciplinary engineering fields. The result achieved in the preferred embodiments is not a mere summary of technologies already applied but makes it possible to produce effects of improved heat-resistance, better thermal fatigue characteristics and corrosion resistance, which considerably exceed the parameters and characteristics obtained by employing the well-known engineering solutions.

Following are the technology embodiments, which were performed during deposition of coating on aircraft gas turbine blades in various sequence; shown also are the test results of high temperature tests, thermal fatigue tests and heat-resistance tests run in the environment of high speed flows of liquid fuel combustion materials.

Coating Deposition Embodiments

No. 1. KR-111 Coating.

The coating was deposited on ZS6K alloy blade following the stages below:

1. Surface cleaning (abrasive cleaning, washing, degreasing, drying)
2. Placement into an ion-plasma deposition chamber equipped with an ion source
3. Ion cleaning
4. Deposition of a zirconium microlayer of 0.1–0.5 microns
5. Ion implantation with argon
6. Placement into an ion-plasma deposition chamber equipped with an ion source for deposition of aluminide microlayer of 50–60 microns in thickness
7. Placement into an ion-plasma deposition chamber equipped with an ion source for deposition of zirconium microlayer of 2–5 microns in thickness
8. Ion implantation with argon
9. Annealing in vacuum of $10^2$ Pa at a temperature of 1050° C. for 60 minutes No. 2 Coating KR-112

The coating was deposited on ZS6K alloy blade following the stages below:
1. Surface cleaning (liquid abrasive cleaning, washing, ultrasound bath, degreasing, drying);
2. Placement of a part to be coated into a commercial MAP-1 equipment with an ion source;
3. Ion cleaning of surface at a voltage U=250–280V and an ion current of 40 A and a current of vacuum arc of 400–750 A, for 3–10 min;
4. Ion implantation with lanthanum La (U-10–40 kV, J=5–20 mA, D=$1.10^{17}$ cm$^{-2}$);
5. Deposition of a condensed coating of Ni—Co(20)-Cr(18)-Al(12)-Y(0.5)% weight of 40–50 microns in thickness;
6. Ion implanation with La;
7. Gas circulation chromium aluminizing (a layer of 20–30 microns);
8. Ion implantation with lanthanum;
9. Annealing in vacuum of $10^{-2}$ Pa at a temperature of 1050° C. for 60 minutes;
10. Ion implantation with lanthanum.

No. 3. Coating KR-113

The coating was deposited on ZS6K alloy blade following the stages below:
1. Pre-cleaning, ion cleaning, implantation with argon;
2. Ion-plasma deposition of chromium carbide to a thickness of 1–2 microns;
3. Ion agitation with argon (U=30–40 kV, J=10–20 mA, D=$1.10^{17}$ cm$^{-2}$);
4. Deposition of a condensed coating microlayer of Ni—Co (20)-Cr(18)-Al(12)-Y(0.6)% weight of 40–50 microns in thickness;
5. Argon implantation of the said MCA microlayer;
6. Gas circulation silicon aluminizing (a layer of 30–40 microns);
7. Argon implantation of the said intermetallic layer;
8. Annealing at a temperature of 1050° C.;
9. Argon implantation.

No. 4. Coating KR-114

The coating was deposited on ZS6K alloy blade following the stages below:
1. Surface cleaning, washing and drying as in the embodiment designated as No. 2;
2. Lanthanum implantation;
3. Deposition of a NiCo28Cr10Al12Y0.2 alloy to a thickness of 40 microns;
4. Lanthanum implantation;
5. Deposition of a many-component alloy of Al12Si1.5Y to a thickness of 20 microns;
6. Lanthanum implantation;
7. Annealing in argon;
8. Argon implantation.

No. 5. Coating KR-115

The coating was deposited on ZS6K alloy blade following the stages below:
1. Surface cleaning, washing and drying as in the embodiment designated as No. 2;
2. Argon implantation;
3. Deposition of a NiCo20Cr18Al14Y1.0 alloy to a thickness of 40 microns;
4. Hafnium implantation;
5. Deposition of a many-component alloy of Al10Si8Ni7Y0.8;
6. Hafnium implantation;
7. Annealing in argon;
8. Argon implantation.

No. 6. Coating KR-116

The coating was deposited on ZS6K alloy blade following the stages below:
1. Surface cleaning, washing and drying as in the embodiment designated as No. 2;
2. Deposition of zirconium;
3. Ion agitation with argon;
4. Gas circulating aluminizing to a thickness of 20 microns;
5. Argon implantation;
6. Deposition of a many-component NiCo20Cr18Al12Y0.6 alloy to a thickness of 30 microns;
7. Argon implantation;
8. Deposition of a many-component alloy of AlSi14Y1.5 to a thickness of 15 microns;
9. Argon implantation;
10. Annealing in argon;
11. Argon implantation.

No. 7. Coating KR-117

The coating was deposited on ZS6K alloy blade following the technology stages below:
1. Surface cleaning, washing and drying as in the embodiment designated as No. 2;
2. Scandium deposition;
3. Ion agitation with argon;
4. Deposition of a NiCo24Cr18Al12Y0.6 alloy to a thickness of 30 microns;
5. Argon implantation;
6. Gas circulating aluminizing;
7. Argon implantation;
8. Annealing in vacuum of $10^{-2}$ Pa at 1050° C. for 1 hr;
9. Argon implantation.

No. 8. Coating KR-118

The coating was deposited on ZS6K alloy blade following the technology stages below:
1. Surface cleaning, washing and drying as in the embodiment designated as No. 2;
2. Scandium deposition;
3. Ion agitation with argon;
4. Gas circulating chromium aluminizing to a thickness of 20 microns;
5. Scandium deposition;
6. Ion agitation with argon;
7. Deposition of a MCA NiCo20Cr18Al12Y0.5 alloy to a thickness of 40 microns;

8. Gas circulating chromium aluminizing to a thickness of 20 microns;
9. Argon implantation.

No. 9. Coating KR-119

The coating was deposited on ZS6K alloy blade following the technology stages below:
1. Surface cleaning, washing and drying as in the embodiment designated as No. 2;
2. Zirconium deposition;
3. Ion agitation with argon;
4. Gas circulating chromium aluminizing to a thickness of 20 microns;
5. Ion agitation with argon;
6. Deposition of a many-component CoCr28Ni30Al10Y0.3 alloy to a thickness of 50 microns;
7. Zirconium deposition;
8. Argon implantation;
9. Annealing in argon;
10. Argon implantation.

No. 10. Coating KR-120

The coating was deposited on ZS6K alloy blade following the technology stages below:
1. Surface cleaning, washing and drying as in the embodiment designated as No. 2;
2. Zirconium deposition to a thickness of 1–5 microns;
3. Ion agitation with argon;
4. Deposition of a many-component NiCo20Cr28Al10Y0.3 alloy to a thickness of 60 microns;
5. Zirconium deposition;
6. Ion agitation with argon;
7. Annealing in argon;
8. Argon implantation.

No. 11. Coating KR-121

The coating was deposited on ZS6K alloy blade following the technology stages below:
1. Surface cleaning, washing and drying as in the embodiment designated as No. 2;
2. Argon implantation;
3. Gas circulating chromium aluminizing to a thickness of 50 microns;
4. Ion etching;
5. Argon implantation;
6. Deposition of a many-component AlSi8Ni8Zr2.5 alloy to a thickness of 30 microns;
7. Argon implantation;
8. Annealing in argon;
9. Argon implantation.

No. 12. Coating KR-122

The coating was deposited on ZS6K alloy blade following the technology stages below:
1. Surface cleaning, washing and drying as in the embodiment designated as No. 2;
2. Deposition of a ceramics layer of $ZrO_2Y_2O_3$ by electron-beam method to a thickness of 40 microns;
3. Yttrium implantation;
4. Annealing in vacuum of $10^{-2}$ Pa at a temperature of 1050° C. for 1 hr;
5. Argon implantation;
6. Deposition of a many-component NiCr18Al12Y0.3 alloy to a thickness of 40 microns;
7. Argon implantation;
8. Gas circulating chromium aluminizing to a thickness of 30 microns;
9. Argon implantation.
10. Deposition of a ceramics layer of $ZrO_2Y_2O_3$ by electron-beam method to a thickness of 40 microns;
11. Yttrium implantation and annealing in vacuum.

Table 1 gives test results for serial (1-aluminized and 2-ion-plasma coating of Ni—CO—Cr—Al—Y) coatings as compared to the results for coatings per present invention. (Heat-resistance tests, corrosion tests and thermal fatigue tests)

TABLE 1

| Coating | Heat-resistance *Δm = mg/cm$^2$ | Corrosion resistance **t = hrs | Thermal fatigue ***N = No. of cycles |
|---|---|---|---|
| 1. Al | 1.50–1.70 | 120–150 | 300–320 |
| 2. MeCrAlY | 1.80–2.20 | 500–600 | 580–630 |
| 3. MeCrAlY + Al | 1.12–1.34 | 840–900 | 700–740 |
| 4. KR-111 | 1.10–1.20 | 450–500 | 400–410 |
| 5. KR-112 | 0.50–0.85 | 1150–1180 | 960–1020 |
| 6. KR-113 | 0.46–0.62 | 1170–1190 | 1020–1100 |
| 7. KR-114 | 0.44–0.61 | 1200–1210 | 1060–1120 |
| 8. KR-115 | 0.58–0.64 | 920–930 | 890–940 |
| 9. KR-116 | 0.42–0.48 | 1280–1310 | 1020–1040 |
| 10. KR-117 | 0.55–0.70 | 1080–1120 | 980–1010 |
| 11. KR-118 | 0.50–0.54 | 960–990 | 960–970 |
| 12. KR-119 | 0.47–0.52 | 980–1100 | 970–990 |
| 13. KR-120 | 0.45–0.80 | 1100–1110 | 940–960 |
| 14. KR-121 | 0.48–0.54 | 1100–1120 | 970–1010 |
| 15. KR-122 | 0.26–0.38 | — | 800–1020 |
| 16. Kr-123 | 0.30–0.34 | 980–1040 | 760–780 |

*Tests for heat-resistance were carried out at 1200° C. Δm = mg/cm$^2$
**Corrosion tests were carried out following a crucible method of testing in a melted Na2SO4 + 25% NaCl at 900° C., durability measured in hours
***Thermal fatigue tests were carried out, with the thermal cycle being 1200–200° C., time of cycle being 200 sec.

We claim:

1. A method for depositing a coating on metal machine parts, the coating comprising a plurality of layers, wherein said layers comprise at least one of each of the following: an intermetallic compound (IM) comprised of aluminides of at least one of Ni, Co or Fe, a multiple-component alloy (MCA), oxides and transitional layers of implanted atoms (TM); the method comprising the following steps:
   1. cleaning a surface to be coated by ion-plasma etching or sputtering by an ion source;
   2. modifying the surface to be coated;
   3. depositing a multiple-component alloy to a thickness of 20–60 microns;
   4. forming at least one of the transitional layers by ion implantation;
   5. effecting ion-plasma deposition of a layer of said intermetallic compound;
   6. forming additional transitional layers by ion agitation;
   7. forming an oxide layer by depositing a ceramics layer and performing electron beam evaporation of said ceramics layer;
   8. annealing in a controlled atmosphere or in a vacuum with a residual pressure of oxygen; and
   9. modifying an outer surface of the coating with implantation,
      wherein the process further comprises the step of diffusion metallization on one of said plurality of layers or on said surface to be coated, said diffusion metallization step occurring before said step of annealing, wherein said diffusion metallization comprises aluminizing, silicon aluminizing or chromium aluminizing to deposit a layer having a thickness of 20–50 microns.

2. A method as defined in claim 1, wherein said step 2) of modifying the surface is carried out by ion implantation.

3. A method as defined in claim 1, wherein said step of modifying the surface to be coated comprises:
   (a) ion-plasma deposition of a layer of a modifying agent and
   (b) a stage of ion agitation.

4. A method as defined in claim 3, wherein said modifying agent is selected from the group consisting of argon, carbon, Group IIIB-IVB metals, chromium and silicon.

5. A method as defined in claim 3, wherein said ion agitation is carried out with inert gas ions.

6. A method as defined in claim 1, wherein said intermetallic compound is additionally doped with one or more of the elements selected from silicon, chromium, boron and zirconium.

7. A method as defined in claim 1, wherein said transitional layers in steps 4 and 6 are formed by implantation of inert gas ions or ions of oxygen, carbon, or ions of elements selected from Groups IIIB-IVB, Cr and Si.

8. A method as defined in claim 1, wherein said step of modifying the surface (2) is carried out by means of an ion source at an accelerating voltage of 10–40 kV and with a fluence (radiation dose) of $10^{14}$–$2\times10^{18}$ ions/cm$^2$.

9. A method as defined in claim 1, wherein after said step of effecting ion-plasma deposition, the method comprises the following additional steps in order:
   1. modifying the surface, by depositing a modifying metal layer on the surface; and
   2. depositing a layer of an intermetallic compound (IM).

10. A method as defined in claim 1, wherein said method additionally comprises the step of ion-plasma deposition of an intermetallic compound prior to the step of deposition of the said multiple-component alloy.

11. A method for depositing a coating on a surface of metal machine parts comprising a plurality of layers, wherein said layers comprise at least one of each of the following: an intermetallic compound (IM) comprising aluminides of at least one of Ni, Co or Fe, a multiple-component alloy (MCA), oxides and transitional layers of implanted atoms (TM); the method comprising at least the following steps:
   1. modifying the surface to be coated;
   2. depositing the multiple-component alloy to a thickness of 10–100 microns;
   3. forming each transitional layer by ion implantation;
   4. depositing a layer of the intermetallic compound IM by ion plasma deposition;
   5. forming an oxide layer by depositing a ceramics layer and performing electron beam evaporation of said ceramics layer;
   6. annealing in a controlled atmosphere, or in a vacuum with a residual pressure of oxygen after said step of forming an oxide layer; and
   7. modifying an outer surface of the coating,
   wherein the process further comprises the step of diffusion metallization on one of said plurality of layers or on said surface to be coated, said diffusion metallization step occurring before or after said step of depositing the multiple-component alloy and before said step of annealing, wherein said diffusion metallization comprises aluminizing, silicon aluminizing, or chromium aluminizing to deposit a layer having a thickness of 20–50 microns.

12. A method as defined in claim 11, wherein said intermetallic compound of step 4 is deposited to a thickness of between 10–100 microns.

13. A method as defined in claim 11, wherein said intermetallic compound of step 4 is deposited to a thickness of from 5–40 microns, and said multiple-component alloy of step 2 is deposited to a thickness of from 10–60 microns.

14. A method as defined in claim 11, wherein said intermetallic compound is deposited to a thickness of from 5–50 microns and said multiple-component alloy is deposited to a thickness of from 10–60 microns.

* * * * *